US009747974B2

(12) United States Patent
Tai et al.

(10) Patent No.: US 9,747,974 B2
(45) Date of Patent: Aug. 29, 2017

(54) NON-VOLATILE MEMORY APPARATUS AND ON-THE-FLY SELF-ADAPTIVE READ VOLTAGE ADJUSTMENT METHOD THEREOF

(71) Applicant: VIA Technologies, Inc., New Taipei (TW)

(72) Inventors: Ying Yu Tai, Mountain View, CA (US); Jiangli Zhu, San Jose, CA (US)

(73) Assignee: VIA Technologies, Inc., New Taipei (TW)

( * ) Notice: Subject to any disclaimer, the term of this patent is extended or adjusted under 35 U.S.C. 154(b) by 0 days.

(21) Appl. No.: 15/172,162

(22) Filed: Jun. 3, 2016

(65) Prior Publication Data
US 2017/0206953 A1    Jul. 20, 2017

Related U.S. Application Data

(60) Provisional application No. 62/280,129, filed on Jan. 19, 2016.

(51) Int. Cl.
*G11C 11/34*    (2006.01)
*G11C 11/56*    (2006.01)
(Continued)

(52) U.S. Cl.
CPC .......... *G11C 11/5642* (2013.01); *G11C 16/26* (2013.01); *G11C 16/3427* (2013.01); *G11C 29/52* (2013.01)

(58) Field of Classification Search
CPC ..... G11C 11/5642; G11C 16/26; G11C 29/52; G11C 16/349; G11C 29/028; G11C 7/04;
(Continued)

(56) References Cited

U.S. PATENT DOCUMENTS 8,793,558 B2    7/2014  Cunningham et al.
9,454,420 B1 *  9/2016  Tai .................... G06F 11/073
(Continued)

OTHER PUBLICATIONS

"Office Action of Taiwan Counterpart Application," dated Apr. 10, 2017, p. 1-p. 6.

*Primary Examiner* — Son Dinh
*Assistant Examiner* — Uyen B Tran
(74) *Attorney, Agent, or Firm* — Jianq Chyun IP Office

(57) ABSTRACT

A non-volatile memory apparatus includes a non-volatile storage circuit and a controller. The non-volatile storage circuit reads a corresponding data voltage set, and converts the corresponding data voltage set to the corresponding data in accordance with the read-voltage parameter of the controller. The controller decides whether to perform the on-the-fly self-adaptive read-voltage adjustment in accordance with the number of error bits of the corresponding data. The on-the-fly self-adaptive read-voltage adjustment includes: providing a left (or lower) read-voltage parameter to the non-volatile storage circuit for converting the corresponding data voltage set to the left corresponding data; providing a right (or higher) read-voltage parameter to the non-volatile storage circuit for converting the corresponding data voltage set to the right corresponding data; and deciding the adjusting-direction and the adjusting-amount of the read-voltage parameter in accordance with the relationship between the corresponding data, the left corresponding data and the right corresponding data.

14 Claims, 4 Drawing Sheets

(51) Int. Cl.
*G11C 16/26* (2006.01)
*G11C 16/34* (2006.01)
*G11C 29/52* (2006.01)

(58) Field of Classification Search
CPC ............. G11C 13/004; G11C 16/3404; G11C 16/3418; G11C 16/3427; G11C 16/3459; G11C 11/419
See application file for complete search history.

(56) References Cited

U.S. PATENT DOCUMENTS

| | | | | |
|---|---|---|---|---|
| 2011/0317488 | A1* | 12/2011 | Tseng ................... | G11C 11/5628 365/185.09 |
| 2015/0242143 | A1* | 8/2015 | Kim ..................... | G06F 3/0619 714/704 |
| 2016/0247561 | A1* | 8/2016 | Shirakawa .......... | G11C 11/5642 |

\* cited by examiner

NON-VOLATILE MEMORY APPARATUS AND ON-THE-FLY SELF-ADAPTIVE READ VOLTAGE ADJUSTMENT METHOD THEREOF

CROSS REFERENCE TO RELATED APPLICATION

This application claims the priority benefit of U.S. provisional application Ser. No. 62/280,129, filed on Jan. 19, 2016. The entirety of the above-mentioned patent application is hereby incorporated by reference herein and made a part of specification.

BACKGROUND OF THE INVENTION

Field of the Invention

The invention generally relates to a non-volatile memory, and in particular, to a non-volatile memory apparatus and an on-the-fly self-adaptive read voltage adjustment method thereof.

Description of Related Art

Compared with the conventional hard disk apparatus, flash memory has the faster read/write performance and the lower power consumption. The flash memory is a normal data storage device. The flash memory may set the read-voltage in accordance with the read-voltage parameter of the read command issued by the controller. The flash memory may also read the data voltage in accordance with the address of the read command. The flash memory converts the data voltage to the corresponding data to the controller in accordance with the read-voltage. To reduce costs, flash memory technology has evolved to become smaller and smaller geometries and higher and higher density (there are more bits in each memory cell), which may cause the reading error become a major issue of the reliability of flash memory. Due to data retention, read disturb or program disturb and other factors which may cause the data voltage offset to the lower (or higher) voltage outputted by the memory cell, and the offset data voltage may cause data reading error. If the read-voltage is not in the appropriate level, and it may cause more error bits in the read/converted corresponding data.

SUMMARY OF THE INVENTION

The invention provides a non-volatile memory apparatus and an on-the-fly self-adaptive read-voltage adjustment method thereof which may decide the adjusting-direction and the adjusting-amount of the read-voltage parameter adaptively.

In an embodiment of the invention provides a non-volatile memory apparatus. The non-volatile memory apparatus includes a non-volatile storage circuit and a controller. The non-volatile storage circuit is configured to set at least one read-voltage in accordance with a read-voltage parameter of a read command, read a corresponding data voltage set in accordance with an address of the read command, and convert the corresponding data voltage set to a corresponding data in accordance with the at least one read-voltage. The controller is coupled to the non-volatile storage circuit for providing the read command and receiving the corresponding data. The controller decides whether to perform the on-the-fly self-adaptive read-voltage adjustment in accordance with the number of error bits of the corresponding data. Wherein, the on-the-fly self-adaptive read-voltage adjustment includes: providing a left (or lower) read-voltage parameter to the non-volatile storage circuit for converting the corresponding data voltage set to a left corresponding data; providing a right (or higher) read-voltage parameter to the non-volatile storage circuit for converting the corresponding data voltage set to a right corresponding data; and deciding an adjusting-direction and an adjusting-amount of the read-voltage parameter in accordance with a relationship between the corresponding data, the left corresponding data and the right corresponding data. Wherein at least one left read-voltage corresponding to the left read-voltage parameter is less than the at least one read-voltage, and at least one right read-voltage corresponding to the right read-voltage parameter is greater than the at least one read-voltage.

In an embodiment of the invention provides an on-the-fly self-adaptive read-voltage adjustment method of a non-volatile memory apparatus. The on-the-fly self-adaptive read-voltage adjustment method includes: providing a read command to a non-volatile storage circuit by the controller, and receiving a corresponding data returned from the non-volatile storage circuit, wherein the non-volatile storage circuit sets at least one read-voltage in accordance with a read-voltage parameter of the read command, reads a corresponding data voltage set in accordance with an address of the read command, and converts the corresponding data voltage set to the corresponding data in accordance with the at least one read-voltage; providing a left (or lower) read-voltage parameter by the controller to the non-volatile storage circuit for converting the corresponding data voltage set to a left corresponding data in accordance with the left read-voltage parameter, wherein at least one left read-voltage corresponding to the left read-voltage parameter is less than the at least one read-voltage; providing a right (or higher) read-voltage parameter by the controller to the non-volatile storage circuit for converting the corresponding data voltage set to a right corresponding data in accordance with the right read-voltage parameter, wherein at least one right read-voltage corresponding to the right read-voltage parameter is greater than the at least one read-voltage; and deciding adaptively an adjusting-direction and an adjusting-amount of the read-voltage parameter in accordance with the relationship between the corresponding data and the left corresponding data and the relationship between the corresponding data and the right corresponding data.

Based on the above, the embodiment of the application providing a non-volatile memory apparatus and an on-the-fly self-adaptive read-voltage adjustment method thereof may provide a read-voltage parameter, a left (or lower) read-voltage parameter and a right (or higher) read-voltage parameter to the non-volatile storage circuit, and the non-volatile storage circuit converts the corresponding data voltage set to a corresponding data, a left corresponding data and a right corresponding data in accordance with the read-voltage parameter, the left read-voltage parameter and the right read-voltage parameter respectively. The controller may decide adaptively the adjusting-direction and the adjusting-amount of the read-voltage parameter (threshold voltage parameter) in accordance with the relationship of the corresponding data, the left corresponding data and the right corresponding data.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
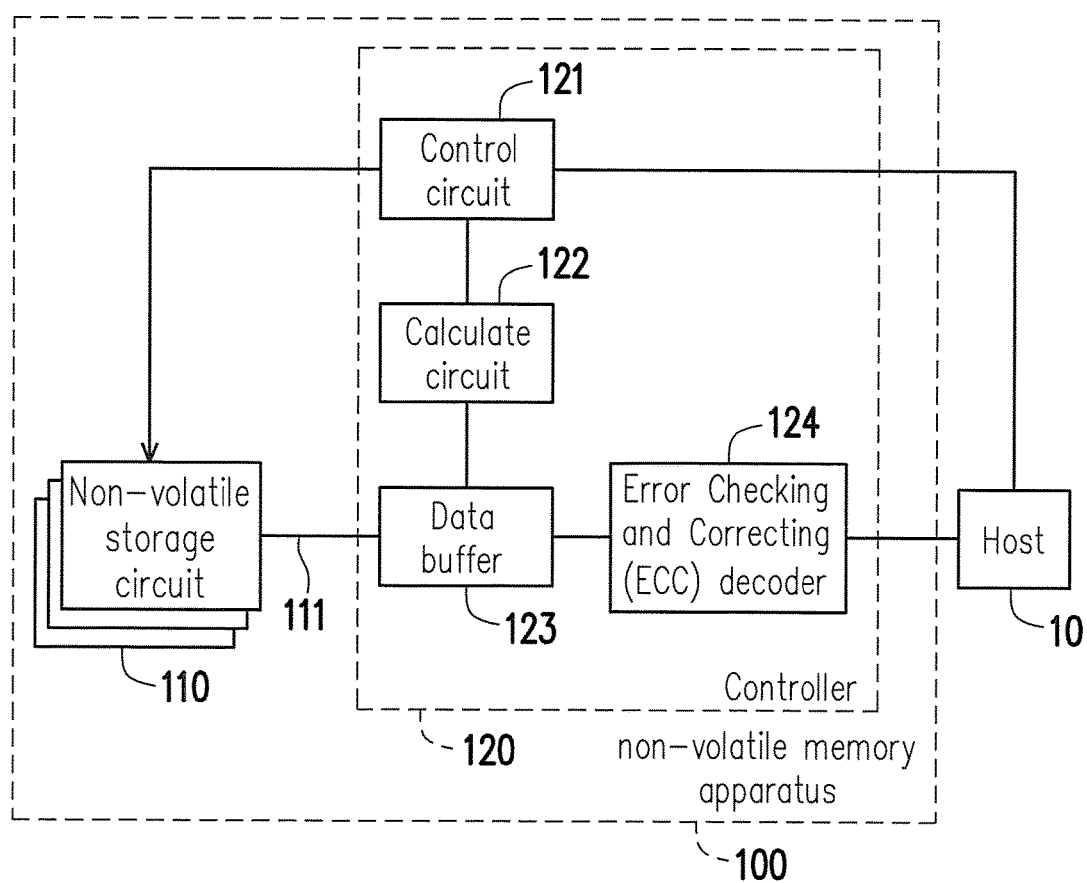
FIG. 1 is a circuit block diagram of non-volatile memory apparatus 100 according to an embodiment of the invention.

In the present case specification (include Claims) used in the "couple (or connect)" which may refer to any direct or indirect connection means. For example, if the text describing the first device is coupled (or connected) to the second devices, it should be interpreted as the first device may be directly connected to the second device, or the first device may be indirectly coupled to the second device through other devices or with some connection means. Besides, where possible, the same reference numerals in the drawings and embodiments elements/components/steps represent the same or similar parts. Different embodiments use the same reference numerals or the same language elements/components/steps can be cross-referenced to the relevant instructions.

FIG. 1 is a circuit block diagram of non-volatile memory apparatus 100 according to an embodiment of the invention. According to the design choice, the non-volatile memory apparatus 100 may be a flash drive, a solid state disc (SSD) or other storage devices. The non-volatile memory apparatus 100 may be coupled to the host 10. The host may be a computer, a handy phone, a multimedia player, a camera or other electronic devices. When the host 10 transmits a read command to the non-volatile memory apparatus 100, the non-volatile memory apparatus 100 may return a corresponding data back to the host 10 in accordance with an address of the read command.

As the embodiment shown in FIG. 1, the non-volatile memory apparatus 100 includes a non-volatile storage circuit 110 and a controller 120. According to the design choice, the non-volatile storage circuit 110 may be a NAND flash memory or other non-volatile storage circuits/element. When the host 10 sends a read command, the non-volatile storage circuit 110 is addressed by the controller 120 in accordance with the read command, so as to read a corresponding data 111 from the non-volatile storage circuit 110, and then the corresponding data is returned back to the host 10.

In detail, the non-volatile storage circuit 110 may set as least one read-voltage (or may be referred to a threshold voltage) in accordance with one (or a set) read-voltage parameter of the read command, and read a corresponding data voltage set in accordance with the address of the read command. According to the at least one read-voltage, the non-volatile storage circuit 110 may convert corresponding data voltage set to a corresponding data 111. Herein, the Multi-Level Cell (MLC) flash memory is taken as an example of the non-volatile storage circuit 110 as shown in FIG. 1. Other types of the flash memory, such as Single Level Cell (SLC), Triple Level Cell (TLC), Quadruple Level Cell (QLC) or other types flash memory, may follow the instruction of MLC flash memory and so on. The non-volatile storage circuit 110 may set an upper page read-voltage VtU1, an upper page read-voltage VtU2 and a lower page read-voltage VtL in accordance with the command of the controller 120. The corresponding data voltage set may be converted to the corresponding data 111 in accordance with the read-voltage VtU1, VtU2 and VtL by the non-volatile storage circuit 110.

Figure 2:
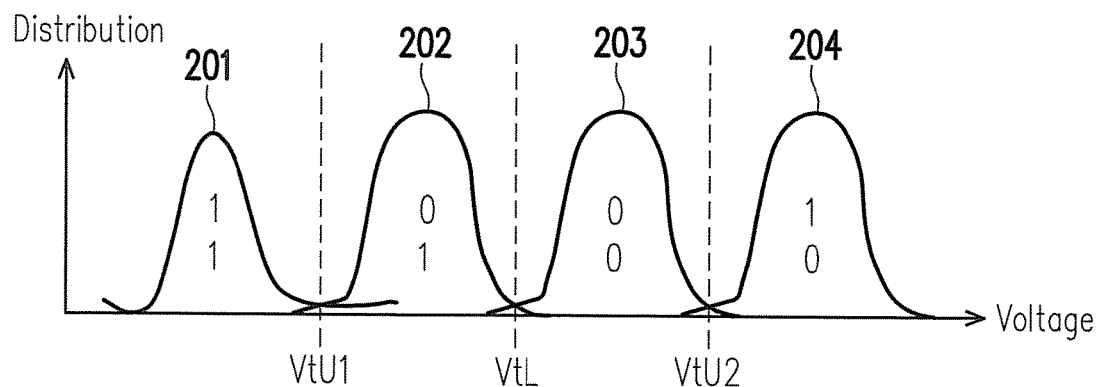
FIG. 2 is a distribution diagram of the corresponding data voltage for illustrating the Multi-Level Cell (MLC) flash memory.

For example, FIG. 2 is a distribution diagram of the corresponding data voltage for illustrating the MLC flash memory. The horizontal axis represents voltage, and the vertical axis represents the distribution as shown in FIG. 2. The non-volatile storage circuit 110 as shown in FIG. 1 may be referred to the instructions in FIG. 2 and so on. The read-voltage (or threshold voltage) of the MLC flash memory includes an upper page read-voltage VtU1, an upper page read-voltage VtU2 and a lower page read-voltage VtL. Four normal distributions curves 201, 202, 203 and 204 are illustrated in FIG. 2, wherein the normal distributions curve 201 presents the data voltage distribution of the memory cell which has an upper page data "1" and a lower page data "1", the normal distributions curve 202 presents the data voltage distribution of the memory cell which has an upper page data "0" and a lower page data "1", the normal distributions curve 203 presents the data voltage distribution of the memory cell which has an upper page data "0" and a lower page data "0", and the normal distributions curve 204 present the data voltage distribution of the memory cell which has an upper page data "1" and a lower page data "0". When the data voltage of a memory cell is less than the read-voltage VtL, the non-volatile storage circuit 110 may be informed that the lower page data of the memory cell is "1". When the data voltage of the memory cell is more than the read-voltage VtL, the non-volatile storage circuit 110 may be informed that the lower page data of the memory cell is "0". When the data voltage of the memory cell is less than the read-voltage VtU1 and VtU2, or when the data voltage of the memory cell is more than the read-voltage VtU1 and VtU2, the non-volatile storage circuit 110 may be informed that the upper page data of the memory cell is "1". When the data voltage of the memory cell is between the read-voltage VtU1 and VtU2, the non-volatile storage circuit 110 may be informed that the upper page data of the memory cell is "0". Therefore, the corresponding data voltage may be converted to the corresponding data 111 in accordance with the read-voltage VtU1, VtU2 and VtL of the non-volatile storage circuit 110.

Figure 3:
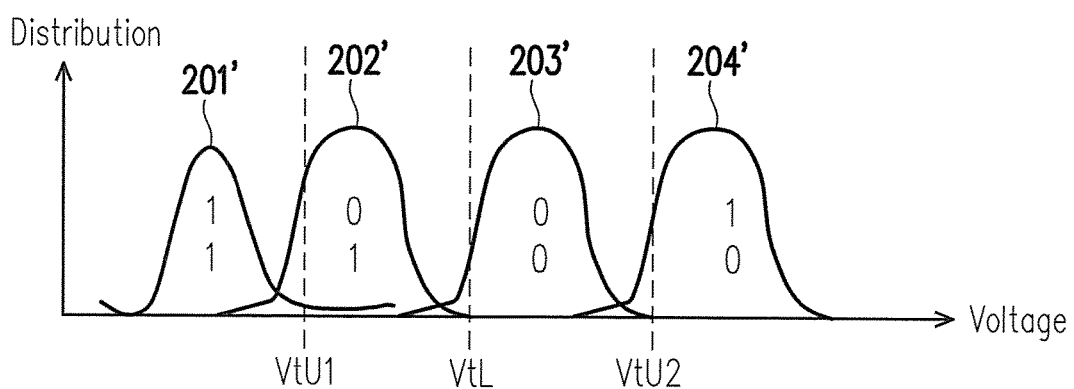
FIG. 3 is an offset diagram illustrating the corresponding data voltage of the MLC flash memory.

Conventional read-voltage is fixed, and the read-voltage VtU1, VtU2 and VtL may not be adjusted adaptively in accordance with the converted corresponding data 111. Due to the data retention, read disturb or program disturb and other factor may cause the data voltage outputted by the memory cell offset to lower (or higher) voltage, and the offset data voltage may cause the data read error. For example, FIG. 3 is an offset diagram illustrating the corresponding data voltage of the MLC flash memory. The horizontal axis represents voltage, and the vertical axis represents the distribution as shown in FIG. 3. Comparing FIG. 2 and FIG. 3 may be found that, the data voltage outputted by the memory cell has shifted to a lower voltage, which may cause the normal distributions curve 201 offset to normal distributions curve 201', the normal distributions curve 202 offset to normal distributions curve 202', the normal distributions curve 203 offset to normal distributions curve 203', and the normal distributions curve 204 offset to normal distributions curve 204'. If the read-voltage VtU1, VtU2 and VtL may not be adjusted adaptively in accordance with the converted corresponding data 111, it may cause more error bits in the read/converted corresponding data 111.

The controller 120 is coupled to the non-volatile storage circuit 110. The controller 120 may provide the read command to the non-volatile storage circuit 110, and receive the corresponding data 111 from the non-volatile storage circuit 110. The controller 120 may perform Error Checking and Correcting (ECC) operation for the corresponding data 111. The ECC operation may check the number of error bits of the corresponding data 111. In the situation that the number of the error bits of the corresponding data 111 do not exceed the tolerance range, the ECC operation still can amend the error bits of the corresponding data 111. The controller 120 may decide whether to perform "on-the-fly self-adaptive read-voltage adjustment" in accordance with the number of the error bits of the corresponding data 111. Such as, when the number of the error bits of the corresponding data 111 exceeds the tolerance range, the controller 120 may perform "on-the-fly self-adaptive read-voltage adjustment".

The "on-the-fly self-adaptive read-voltage adjustment" includes the following step. The controller 120 provides the read command to the non-volatile storage circuit 110, wherein the non-volatile storage circuit 110 sets the read-voltage in accordance with the read-voltage parameter of the read command, reads a corresponding data voltage set in accordance with the address of the read command, and converts the corresponding data voltage set to the corresponding data in accordance with the read-voltage. The controller 120 may also provide a left (or lower) read-voltage parameter to the non-volatile storage circuit 110, so that the non-volatile storage circuit 110 converts the same corresponding data voltage set to the left corresponding data in accordance with the left read-voltage parameter. The controller 120 may also provide a right (or higher) read-voltage parameter to the non-volatile storage circuit 110, so that the non-volatile storage circuit 110 may convert the same corresponding data voltage set to the right corresponding data in accordance with the right read-voltage parameter. Wherein, the left read-voltage corresponding to the left read-voltage parameter is less than the read-voltage, and the right read-voltage corresponding to the right read-voltage parameter is greater than the read-voltage. That is, the controller 120 may control the non-volatile storage circuit 110 to perform data reading for the same address with different read-voltages (or convert the same corresponding data voltage set to different sets of corresponding data with the different read-voltages), and receive three corresponding data, that is the corresponding data, the left corresponding data and the right corresponding data. According to relationship of the corresponding data and the left corresponding data, and according to the relationship of the corresponding data and the right corresponding data, the controller 120 may decide adaptively the adjusting-direction and the adjusting-amount of the read-voltage parameter, to control the non-volatile storage circuit 110 to adjust the read-voltage (such as, adjust the read-voltage VtU1, VtU2 and/or VtL as shown in FIG. 2 and FIG. 3).

In the embodiment as shown in FIG. 1 (other embodiment is not limited thereto), the controller 120 includes a control circuit 121, a calculating circuit 122, a data buffer 123 and a ECC decoder 124. The control circuit 21 coupled to the non-volatile storage circuit 110, is configured to provide the read command. The non-volatile storage circuit 110 decides the level of the read-voltage Vt in accordance with the control circuit 121 (such as read-voltage VtU1, VtU2 and VtL as shown in FIG. 2 and FIG. 3). The non-volatile storage circuit 110 reads a corresponding data 111 from a corresponding plurality of flash memory cells in accordance with the read-voltage Vt. The data buffer 123 coupled to the non-volatile storage circuit 110 for receiving the corresponding data 111. The ECC decoder 124 coupled to the data buffer 123, is configured to check the number of the error bits of the corresponding data 111. In the situation that without the number of the error bits of the corresponding data 111 exceeds the tolerance range, the ECC decoder 124 may still amend the error bits of the corresponding data 111, and then return the amended corresponding data back to the host 10. The algorithm performed by ECC decoder 124 is not limited in the embodiment. Such as, in some embodiments, the ECC decoder 124 may perform Bose-Chaudhuri-Hocquengh (BCH) code algorithm, Low Density Parity Check (LDPC) code algorithm or other ECC algorithm.

Check with the ECC decoder 124, the control circuit 121 may decide whether to perform "on-the-fly self-adaptive read-voltage adjustment" in accordance with the number of error bits of the corresponding data 111. Such as, when the number of the error bits of the corresponding data 111 exceeds the tolerance range, the control circuit 121 may perform "on-the-fly self-adaptive read-voltage adjustment". The calculating circuit 122 is coupled to the data buffer 123. Based on the control of the control circuit 121, the calculating circuit 122 may perform "on-the-fly self-adaptive read-voltage adjustment", to decide an adjusting-direction and an adjusting-amount of the read-voltage parameter, and return the adjusting-direction and the adjusting-amount back to the control circuit 121. The control circuit 121 may adjust adaptively the read-voltage parameter base on the adjusting-direction and the adjusting-amount provided by the calculating circuit 122, so as to provide the adjusted read-voltage parameter to the non-volatile storage circuit 110. Based on the control of the adjusted read-voltage parameter provided by the control circuit 121, the non-volatile storage circuit 110 may adjust the read-voltage Vt adaptively (such as, adjust the read-voltage VtU1, VtU2 and/or VtL as shown in FIG. 2 and FIG. 3).

Figure 4:
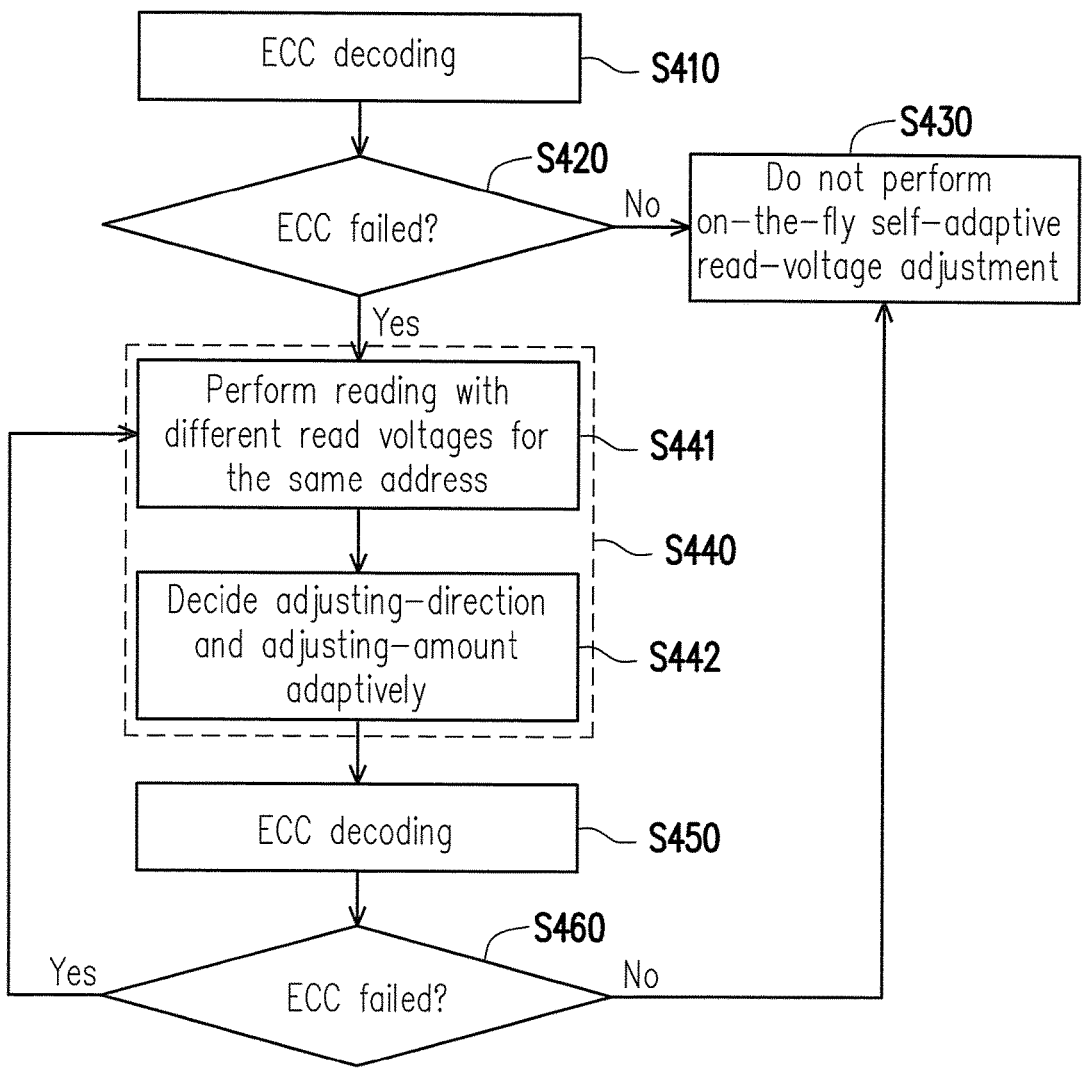
FIG. 4 is a flow diagram illustrating an on-the-fly self-adaptive read-voltage adjustment method according to an embodiment of the invention.

FIG. 4 is a flow diagram illustrating an on-the-fly self-adaptive read-voltage adjustment method according to an embodiment of the invention. Referring to FIG. 1 and FIG. 4, after the non-volatile storage circuit 110 reads the corresponding data 111 with the read-voltage Vt (such as, corresponding data R1), the ECC decoder 124 performs error correction on the corresponding data R1 in step S410. The control circuit 121 may determine whether the correction of the ECC decoder 124 is success or not in step S420. If the correction of the ECC decoder 124 is successfully (the number of the error bits of the corresponding data R1 is less than the tolerance range) in step S420, and the controller 120 moves to step S430, that is not to perform "on-the-fly self-adaptive read-voltage adjustment". If the correction of the ECC decoder 124 is failed, the controller 120 moves to step S440, that is to perform "on-the-fly self-adaptive read-voltage adjustment".

In the embodiment as shown in FIG. 4, step S440 includes sub-step S441 and S442. In step S441, the controller 120 may control the non-volatile storage circuit 110 to perform data reading for the same address with different read-voltages (or convert the same corresponding data voltage set to different sets of corresponding data with the different read-voltages), and receive three corresponding data, that is the corresponding data R1, the left corresponding data R2 and the right corresponding data R3. In detail, the control circuit 121 of the controller 120 may provide the read command to the non-volatile storage circuit 110 in step S441, so as to receive the corresponding data R1 returned from the non-volatile storage circuit 110. Wherein, the non-volatile storage circuit 110 sets the read-voltage Vt in accordance with the read-voltage parameter of the read command, reads a corresponding data voltage set in accordance with the address of the read command, and converts the corresponding data voltage set to the corresponding data R1 according to the read-voltage Vt. The control circuit 121 of the controller 120 further provides the left read-voltage parameter to the non-volatile storage circuit 110 in step S441, and the non-volatile storage circuit 110 converts the corresponding data voltage set to the left corresponding data R2 in accordance with the left read-voltage parameter, wherein the left read-voltage Vt_left corresponding to the left read-voltage parameter is less than the read-voltage Vt. The control circuit 121 of the controller 120 further provides a right (or higher) read-voltage parameter to the non-volatile storage circuit 110 in step S441, and the non-volatile storage circuit 110 converts the corresponding data voltage set to the right corresponding data R3 in accordance with the right read-voltage parameter, wherein the right read-voltage Vt_right corresponding to the right read-voltage parameter is more than the read-voltage Vt. The non-volatile storage circuit 110 converts the same corresponding data voltage set to the different sets of corresponding data in accordance with using one of a left read-voltage Vt_left of the read-voltage Vt left side (lower side) and a right read-voltage Vt_right of the read-voltage Vt right side (higher side), that is the left corresponding data R2 and the right corresponding data R3.

In step S442, according to relationship of the corresponding data R1 and the left corresponding data R2, and according to the relationship of the corresponding data R1 and the right corresponding data R3, the calculating circuit 122 of the controller 120 may perform Self-Adaptive Vt Calculation, so as to decide adaptively the adjusting-direction and adjusting-amount of the read-voltage parameter, and further control the non-volatile storage circuit 110 to adjust the read-voltage Vt (such as, adjust the read-voltage VtU1, VtU2 and/or VtL as shown in FIG. 2 and FIG. 3). Therefore, the controller 120 may dynamically find a better read-voltage Vt.

After complete the regulation of the read-voltage Vt, the control circuit 121 of the controller 120 may control the non-volatile storage circuit 110 to read the corresponding data 111 with the adjusted read-voltage Vt. After the non-volatile storage circuit 110 reads the corresponding data 111 with the adjusted read-voltage Vt (such as, the corresponding data R1'), the ECC decoder 124 performs error correction on the corresponding data R1' in step S450. The control circuit 121 may determine whether the correction of the ECC decoder 124 is success or not in step S460. If the correction of the ECC decoder 124 is successfully (the number of the error bits of the corresponding data R1' is less than the tolerance range), and the controller 120 moves to step S430, that is not to perform "on-the-fly self-adaptive read-voltage adjustment". If the correction of the ECC decoder 124 is failed, the controller 120 moves to step S440, that is to perform "on-the-fly self-adaptive read-voltage adjustment".

The following takes the MLC flash memory as an illustrated example, to illustrate the embodiment of "on-the-fly self-adaptive read-voltage adjustment". The "on-the-fly self-adaptive read-voltage adjustment" may refer to the following instructions and embodiments and so on/extend to SLC, TLC, QLC or other type of the flash memory.

Figure 5:
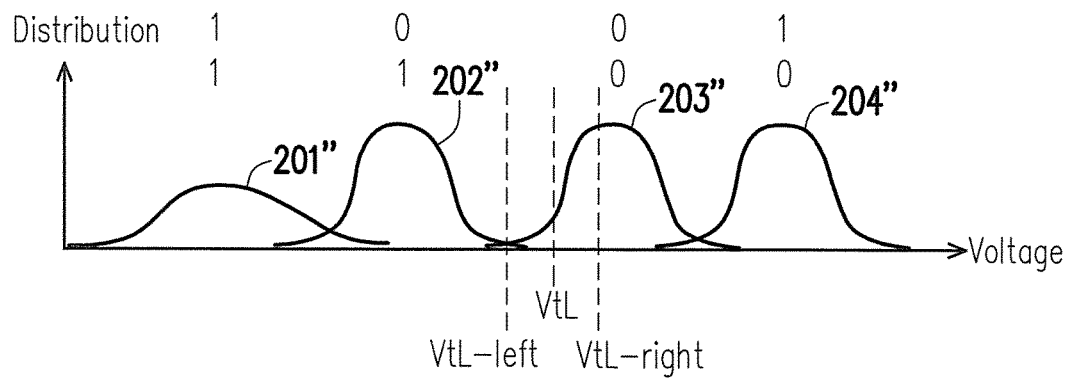
FIG. 5 and FIG. 6 are distribution diagrams of the corresponding data voltage of the MLC flash memory according to an embodiment of the invention illustrating when performing "on-the-fly self-adaptive read-voltage adjustment".
Figure 6:
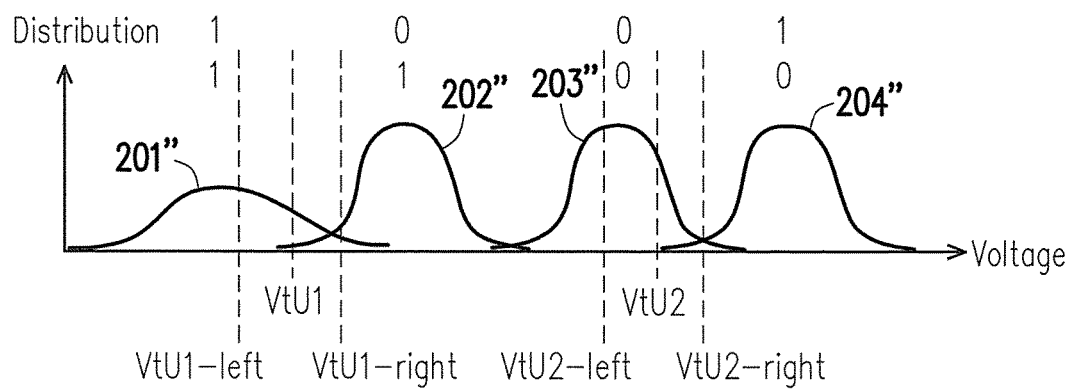

Herein would illustrate an embodiment of the controller 120 perform "on-the-fly self-adaptive read-voltage adjustment" for the non-volatile storage circuit 110 (such as a MLC flash memory) for the lower page data. The read-voltage Vt of the MLC flash memory (or threshold voltage) includes an upper page read-voltage VtU1, an upper page read-voltage VtU2 and a lower page read-voltage VtL. FIG. 5 and FIG. 6 are distribution diagrams of the corresponding data voltage of the MLC flash memory according to an embodiment of the invention illustrating when performing the "on-the-fly self-adaptive read-voltage adjustment". The horizontal axis represents voltage, and the vertical axis represents the distribution as shown in FIGS. 5, 6. After comparing FIG. 2 and FIG. 5 (or comparing FIG. 2 and FIG. 6) may find that, the data voltage outputted by the memory cell has shifted to the lower voltage, which cause the normal distributions curve 201 offset to the normal distributions curve 201", the normal distributions curve 202 offset to the normal distributions curve 202", the normal distributions curve 203 offset to the normal distributions curve 203", and the normal distributions curve 204 offset to the normal distributions curve 204". When the data R1 read by the non-volatile storage circuit 110 with the read-voltage Vt for performing ECC decode is failed, the control circuit 121 of the controller 120 may control the calculating circuit 122 to perform "on-the-fly self-adaptive read-voltage adjustment".

First, the control circuit 121 of the controller 120 may provide a read-voltage parameter, a left (or lower) read-voltage parameter and a right (or higher) read-voltage parameter to the non-volatile storage circuit 110 in different periods, for the non-volatile storage circuit 110 converts the same corresponding data voltage set to the corresponding data R1, the left corresponding data R2 and the right corresponding data R3 in accordance with the read-voltage parameter, the left read-voltage parameter and the right read-voltage parameter respectively. Wherein, the read-voltage parameter includes a lower page read-voltage parameter (corresponding to the lower page read-voltage VtL as shown in FIG. 5), a first upper page read-voltage parameter (corresponding to the upper page read-voltage VtU1 as shown in FIG. 6) and a second upper page read-voltage parameter (corresponding to the upper page read-voltage VtU2 as shown in FIG. 6), the left read-voltage parameter includes a lower page left read-voltage parameter (corresponding to the lower page left read-voltage VtL-left as shown in FIG. 5), a first upper page left read-voltage parameter (corresponding to the upper page left read-voltage VtU1-left as shown in FIG. 6) and a second upper page left read-voltage parameter (corresponding to the upper page left read-voltage VtU2-left as shown in FIG. 6), and the right read-voltage parameter includes a lower page right read-voltage parameter (corresponding to the lower page right read-voltage VtL-right as shown in FIG. 5), a first upper page right read-voltage parameter (corresponding to the upper page right read-voltage VtU1-right as shown in FIG. 6) and a second upper page right read-voltage parameter (corresponding to the upper page right read-voltage VtU2-right as shown in FIG. 6). The corresponding data R1 includes a lower page corresponding data R1L and an upper page corresponding data R1U, the left corresponding data R2 includes a lower page left corresponding data R2L and an upper page left corresponding data R2U, and the right corresponding data R3 includes a lower page right corresponding data R3L and an upper page right corresponding data R3U. The control circuit 121 of the controller 120 provide the lower page read-voltage parameter to the non-volatile storage circuit 110, for the non-volatile storage circuit 110 converts the corresponding data voltage to the lower page corresponding data R1L in accordance with the lower page read-voltage parameter. The control circuit 121 of the controller 120 further provides the lower page left read-voltage parameter to the non-volatile storage circuit 110, for the non-volatile storage circuit 110 converts the corresponding data voltage to the lower page left corresponding data R2L in accordance with the lower page left read-voltage parameter. The control circuit 121 of the controller 120 further provides the lower page right read-voltage parameter to the non-volatile storage circuit 110, for the non-volatile storage circuit 110 converts the corresponding data voltage to the lower page right corresponding data R3L in accordance with the lower page right read-voltage parameter.

After receiving the lower page corresponding data R1L, the lower page left corresponding data R2L and the lower page right corresponding data R3L, the calculating circuit 122 of the controller 120 may perform the following calculation. The calculating circuit 122 of the controller 120 may calculate R12L=R1L XOR R2L to obtain the calculation result R12L, and calculate R13L=R1L XOR R3L to obtain the calculation result R13L, wherein the "XOR" represent exclusive OR operation. The calculating circuit 122 of the controller 120 may count the amount N12 of bits with logic 1 in the calculation result R12L, and count the amount N13 of bits with logic 1 in the calculation result R13L. For example, if the calculation result R12L is "01001010" (take 8 bits as an example, but it is not limited thereto), and the amount N12 of the bits with logic 1 in the calculation result R12L is 3. The calculating circuit 122 of the controller 120 may decide the adjusting-direction and the adjusting-amount of the lower page read-voltage parameter in accordance with the relationship of the amount N12 and the amount N13.

Herein would illustrate how the calculating circuit 122 decide the adjusting-direction of the lower page read-voltage parameter (corresponding to the lower page read-voltage VtL as shown in FIG. 5) in accordance with the relationship of the amount N12 and the amount N13. When N12−N13>0, the calculating circuit 122 of the controller 120 may inform the control circuit 121 to increase the lower page read-voltage parameter, that is move the lower page read-voltage VtL to the right as shown in FIG. 5. When N12−N13<0, the calculating circuit 122 of the controller 120 may inform the control circuit 121 to decrease the lower page read-voltage parameter, that is move the lower page read-voltage VtL to the left as shown in FIG. 5. Take the situation of FIG. 5 as an example, the amount N12 is less than the amount N13, such that the calculating circuit 122 of the controller 120 may inform the control circuit 121 to decrease the lower page read-voltage parameter (move the lower page read-voltage VtL to the left as shown in FIG. 5).

Herein would illustrate how the calculating circuit 122 decide the adjusting-amount of the lower page read-voltage parameter (corresponding to the lower page read-voltage VtL as shown in FIG. 5) in accordance with the relationship of the amount N12 and the amount N13. Based on the characterization data, equation or lookup table of the flash memory, the calculating circuit 122 may obtain the adjusting-amount AdjL of the lower page read-voltage parameter, wherein the adjusting-amount AdjL is proportional to |N12−N13|. For example, the calculating circuit 122 of the controller 120 may calculate AdjL=kL*|N12−N13|, wherein the coefficient kL is real number, to obtain the adjusting-amount AdjL of the lower page read-voltage parameter. The coefficient kL may be determined according to the design choice.

Herein would illustrate an embodiment of the controller 120 perform "on-the-fly self-adaptive read-voltage adjustment" for the non-volatile storage circuit 110 (such as a MLC flash memory) for the upper page data. Referring to FIG. 1 and FIG. 6, the control circuit 121 of the controller 120 provides the first upper page read-voltage parameter and the second upper page read-voltage parameter to the non-volatile storage circuit 110, for the non-volatile storage circuit 110 converts the corresponding data voltage to the upper page corresponding data R1U in accordance with the first upper page read-voltage parameter and the second upper page read-voltage parameter. The control circuit 121 of the controller 120 further provides the first upper page left read-voltage parameter (corresponding to the upper page left read-voltage VtU1-left as shown in FIG. 6) and the second upper page left read-voltage parameter (corresponding to the upper page left read-voltage VtU2-left as shown in FIG. 6) to the non-volatile storage circuit 110, for the non-volatile storage circuit 110 converts the corresponding data voltage set to the upper page left corresponding data R2U in accordance with the first upper page left read-voltage parameter and the second upper page left read-voltage parameter. The control circuit 121 of the controller 120 further provides the first upper page right read-voltage parameter (corresponding to the upper page right read-voltage VtU1-right as shown in FIG. 6) and the second upper page right read-voltage parameter (corresponding to the upper page right read-voltage VtU2-right as shown in FIG. 6) to the non-volatile storage circuit 110, for the non-volatile storage circuit 110 converts the corresponding data voltage set to the upper page right corresponding data R3U in accordance with the first upper page right read-voltage parameter and the second upper page right read-voltage parameter.

After receiving the upper page corresponding data R1U, the upper page left corresponding data R2U and the upper page right corresponding data R3U, the calculating circuit 122 of the controller 120 may perform the following calculation. The calculating circuit 122 of the controller 120 may compare the upper page corresponding data R1U and the upper page left corresponding data R2U, to count the amount NA12 of bits changed from logic 1 to logic 0 between the upper page corresponding data R1U and the upper page left corresponding data R2U and count the amount NC12 of bits changed from logic 0 to logic 1 between the upper page corresponding data R1U and the upper page left corresponding data R2U. For example, if the upper page corresponding data R1U is "0100 1010" and the upper page left corresponding data R2U is "0110 1100" (take 8 bits as an example, but it is not limited thereto), and the amount NA12 of bits changed from logic 1 to logic 0 is 1, and the amount NC12 of bits changed from logic 0 to logic 1 is 2. Similar calculation, the calculating circuit 122 of the controller 120 may further compare the upper page corresponding data R1U and the upper page right corresponding data R3U, to count the amount NA13 of bits changed from logic 0 to logic 1 between the upper page corresponding data R1U and the upper page right corresponding data R3U and count the amount NC13 of bits changed from logic 1 to logic 0 between the upper page corresponding data R1U and the upper page right corresponding data R3U. For example, if the upper page corresponding data R1U is "0100 1010" and the upper page right corresponding data R3U is "1110 0101" (take 8 bits as an example, but it is not limited thereto), and the amount NC13 of bits changed from logic 1 to logic 0 is 2, and the amount NA13 of bits changed from logic 0 to logic 1 is 4. The calculating circuit 122 of the controller 120 may determine the adjusting-direction and the adjusting-amount of the first upper page read-voltage parameter (corresponding to the upper page read-voltage VtU1 as shown in FIG. 6) in accordance with the relationship of the amount NA12 and the amount NA13. The calculating circuit 122 of the controller 120 may determine the adjusting-direction and the adjusting-amount of the second upper page read-voltage parameter (corresponding to the upper page read-voltage VtU2 as shown in FIG. 6) in accordance with the relationship of the amount NC12 and the amount NC13.

Herein would illustrate how the calculating circuit 122 determines the adjusting-direction of the first upper page read-voltage parameter (corresponding to the upper page read-voltage VtU1 as shown in FIG. 6) in accordance with the relationship of amount NA12 and the amount NA13, and how to determine the adjusting-direction of the second upper page read-voltage parameter (corresponding to the upper page read-voltage VtU2 as shown in FIG. 6) in accordance with the relationship of the amount NC12 and the amount NC13. When NA12−NA13>0, the calculating circuit 122 of the controller 120 may inform the control circuit 121 to increase the first upper page read-voltage parameter, that is the upper page read-voltage VtU1 is moved to right as shown in FIG. 6. When NA12−NA13<0, the calculating circuit 122 of the controller 120 may inform the control circuit 121 to decrease the first upper page read-voltage parameter, that is the upper page read-voltage VtU1 is moved to left as shown in FIG. 6. Take the situation as shown in FIG. 6 as an example, the amount NA12 is more than the amount NA13, which may cause the calculating circuit 122 of the controller 120 to inform the control circuit 121 to increase the first upper page read-voltage parameter (the upper page read-voltage VtU1 is moved to right as shown in FIG. 6). When NC12−NC13>0, the calculating circuit 122 of the controller 120 may inform the control circuit 121 to increase the second upper page read-voltage parameter, that is the upper page read-voltage VtU2 is moved to right as shown in FIG. 6. When NC12−NC13<0, calculating circuit 122 of the controller 120 may inform the control circuit 121 to decrease the second upper page read-voltage parameter, that is the upper page read-voltage VtU is moved to left as shown in FIG. 6. Take the situation as shown in FIG. 6 as an example, the amount NC12 is more than the amount NC13, which may cause the calculating circuit 122 of the controller 120 may inform the control circuit 121 to increase the second upper page read-voltage parameter (the upper page read-voltage VtU2 is moved to right as shown in FIG. 6).

Herein would illustrate how the calculating circuit 122 determines the adjusting-amount of the first upper page read-voltage parameter (corresponding to the upper page read-voltage VtU1 as shown in FIG. 6) in accordance with the relationship of the amount NA12 and the amount NA13, and determines the adjusting-amount of the second upper page read-voltage parameter (corresponding to the upper page read-voltage VtU2 as shown in FIG. 6) in accordance with the relationship of the amount NC12 and the amount NC13. Based on the feature data, formula or lookup table of the flash memory, the calculating circuit 122 may obtain the adjusting-amount AdjU1 of the first upper page read-voltage parameter and the adjusting-amount AdjU2 of the second upper page read-voltage parameter, wherein the adjusting-amount AdjU1 is proportional to |NA12−NA13|, and the adjusting-amount AdjU2 is proportional to |NC12−NC13|. For example, the calculating circuit 122 of the controller 120 may calculate AdjU1=kU1*|NA12−NA13| to obtain the adjusting-amount AdjU1 of the first upper page read-voltage parameter, and calculate AdjU2=kU2*|NC12−NC13| to obtain the adjusting-amount AdjU2 of the second upper page read-voltage parameter, wherein the coefficient kU1 and the coefficient kU2 are real number. The coefficient kU1 and the coefficient kU2 may be determined according to the design choice.

It should be noted that, in the different situations, the instruction of the controller 120, the control circuit 121, the calculating circuit 122, the data buffer 123 and/or the ECC decoder 124 may use general programming languages (such as, C or C++), hardware description languages (such as, Verilog HDL or VHDL) or other suitable programming languages to achieve the software, firmware or hardware. The software (or firmware) performed the instruction can be arranged in any known computer-accessible medias, such a, magnetic tapes, semiconductors memory, magnetic disks or compact disks (such as, CD-ROM or DVD-ROM), or Internet, wired communication, wireless communication or other communications medium for transmit the software (or firmware). The software (or firmware) may be stored in the accessible media of the computer, for the CPU of the computer to store/perform the programming codes of the software (or firmware). Besides, the apparatus and the method of the application may be achieved through a combination of hardware and software.

In summary, the non-volatile memory apparatus 100 and the on-the-fly self-adaptive read-voltage adjustment method thereof may provide a read-voltage parameter, a left (or lower) read-voltage parameter and a right (or higher) read-voltage parameter to the non-volatile storage circuit 110 in each of the embodiments of the application, for the non-volatile storage circuit 110 converts the same corresponding data voltage set to the corresponding data R1, the left corresponding data R2 and the right corresponding data R3 in accordance with the read-voltage parameter, the left read-voltage parameter and the right read-voltage parameter respectively. The controller 120 may decide the adjusting-direction and the adjusting-amount of the read-voltage parameter (threshold voltage parameter) adaptively in accordance with the relationship of the corresponding data R1, the left corresponding data R2 and the right corresponding data R3. The non-volatile memory apparatus 100 and on-the-fly self-adaptive read-voltage adjustment method thereof may instant adaptively adjust the read-voltage, to covers all variations, such as, variations of page to page, word line to word line, block for block, chip to chip, channel to channel and driver to driver. The non-volatile memory apparatus 100 and the on-the-fly self-adaptive read-voltage adjustment method thereof may effectively reduce the number of the error bits of the corresponding data 111 read by the non-volatile storage circuit 110.

Although the invention has been described above with embodiments, however it is not limited thereto. It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A non-volatile memory apparatus comprising:
a non-volatile storage circuit configured to set at least one read-voltage in accordance with a read-voltage parameter of a read command, read a corresponding data voltage set in accordance with an address of the read command, and convert the corresponding data voltage set to a corresponding data in accordance with the at least one read-voltage; and a controller, coupled to the non-volatile storage circuit for providing the read command and receiving the corresponding data, and configured to decide whether to perform an on-the-fly self-adaptive read-voltage adjustment in accordance with a number of error bits of the corresponding data, wherein the on-the-fly self-adaptive read-voltage adjustment comprises: providing a left read-voltage parameter to the non-volatile storage circuit for converting the corresponding data voltage set to a left corresponding data; providing a right read-voltage parameter to the non-volatile storage circuit for converting the corresponding data voltage set to a right corresponding data; and deciding an adjusting-direction and an adjusting-amount of the read-voltage parameter in accordance with a relationship between the corresponding data, the left corresponding data and the right corresponding data, wherein at least one left read-voltage corresponding to the left read-voltage parameter is less than the at least one read-voltage, and at least one right read-voltage corresponding to the right read-voltage parameter is greater than the at least one read-voltage, wherein the corresponding data comprises a lower page corresponding data R1L, and the non-volatile storage circuit converts the corresponding data voltage set to obtain a lower page left corresponding data R2L of the left corresponding data, the non-volatile storage circuit converts the corresponding data voltage set to obtain a lower page right corresponding data R3L of the right corresponding data, wherein the controller calculates R1L XOR R2L to obtain a calculation result R12L, the controller counts N12 with logic 1 in the calculation result R12L, the controller calculates R1L XOR R3L to obtain a calculation result R13L, the controller counts N13 with logic 1 in the calculation result R13L, the controller decides an adjusting-direction and an adjusting-amount of a lower page read-voltage parameter of the read-voltage parameter in accordance with a relationship between N12 and N13, wherein N12 and N13 are amount of bits.

2. The non-volatile memory apparatus according to claim 1, wherein the non-volatile storage circuit is a multi-level cell flash memory, and the controller provides a lower page left read-voltage parameter of the left read-voltage parameter to the non-volatile storage circuit for converting the corresponding data voltage set to the lower page left corresponding data R2L of the left corresponding data in accordance with the lower page left read-voltage parameter, the controller provides a lower page right read-voltage parameter of the right read-voltage parameter to the non-volatile storage circuit for converting the corresponding data voltage set to the lower page right corresponding data R3L of the right corresponding data in accordance with the lower page right read-voltage parameter.

3. The non-volatile memory apparatus according to claim 2, wherein the controller increases the lower page read-voltage parameter when N12−N13>0, the controller decrease the lower page read-voltage parameter when N12−N13<0, and the controller calculates $AdjL=kL*|N12-N13|$ to obtain the adjusting-amount AdjL of the lower page read-voltage parameter of the read-voltage parameter, wherein kL is a real number.

4. The non-volatile memory apparatus according claim 1, wherein the controller comprising:

a data buffer coupled to the non-volatile storage circuit for receiving the corresponding data;

a error checking and correcting decoder coupled to the data buffer for checking the number of the error bits of the corresponding data;

a calculating circuit, coupled to the data buffer, and configured to perform the on-the-fly self-adaptive read-voltage adjustment to decide the adjusting-direction and the adjusting-amount of the read-voltage parameter; and a control circuit, coupled to the non-volatile storage circuit for providing the read command, and configured to adjust the read-voltage parameter in accordance with the adjusting-direction and the adjusting-amount provided by the calculating circuit, so as to provide the read-voltage parameter to the non-volatile storage circuit.

5. An on-the-fly self-adaptive read-voltage adjustment method of a non-volatile memory apparatus comprising:

providing a read command by a controller to a non-volatile storage circuit, and receiving a corresponding data returned from the non-volatile storage circuit, wherein the non-volatile storage circuit sets at least one read-voltage according to a read-voltage parameter of the read command, reads a corresponding data voltage set in accordance with an address of the read command, and converts the corresponding data voltage set to the corresponding data in accordance with the at least one read-voltage;

providing a left read-voltage parameter by the controller to the non-volatile storage circuit for converting the corresponding data voltage set to a left corresponding data in accordance with the left read-voltage parameter, wherein at least one left read-voltage corresponding to the left read-voltage parameter is less than the at least one read-voltage;

providing a right read-voltage parameter by the controller to the non-volatile storage circuit for converting the corresponding data voltage set to a right corresponding data in accordance with the right read-voltage parameter, wherein at least one right read-voltage corresponding to the right read-voltage parameter is greater than the at least one read-voltage; and deciding adaptively an adjusting-direction and an adjusting-amount of the read-voltage parameter in accordance with a relationship between the corresponding data and the left corresponding data and a relationship between the corresponding data and the right corresponding data, wherein the corresponding data comprises a lower page corresponding data R1L, and the step of deciding adaptively the adjusting-direction and the adjusting-amount of the read-voltage parameter comprises:

converting the corresponding data voltage set to obtain a lower page left corresponding data R2L of the left corresponding data;

converting the corresponding data voltage set to obtain a lower page right corresponding data R3L of the right corresponding data;

calculating R1L XOR R2L to obtain a calculation result R12L by the controller;

counting N12 with logic 1 in the calculation result R12L by the controller;

calculating R1L XOR R3L to obtain a calculation result R13L by the controller;

counting N13 with logic 1 in the calculation result R13L by the controller; and deciding an adjusting-direction and an adjusting-amount of a lower page read-voltage parameter of the read-voltage parameter by the controller in accordance with a relationship between N12 and N13, wherein N12 and N13 are amount of bits.

6. The on-the-fly self-adaptive read-voltage adjustment method according to claim 5, wherein the non-volatile storage circuit is a multi-level cell flash memory, and the step of deciding adaptively the adjusting-direction and the adjusting-amount of the read-voltage parameter comprises:

providing a lower page left read-voltage parameter of the left read-voltage parameter by the controller to the non-volatile storage circuit for converting the corresponding data voltage set to the lower page left corresponding data R2L of the left corresponding data in accordance with the lower page left read-voltage parameter; and providing a lower page right read-voltage parameter of the right read-voltage parameter by the controller to the non-volatile storage circuit for converting the corresponding data voltage set to the lower page right corresponding data R3L of the right corresponding data in accordance with the lower page right read-voltage parameter.

7. The on-the-fly self-adaptive read-voltage adjustment method according to claim 6, wherein the step of deciding the adjusting-direction and the adjusting-amount of the lower page read-voltage parameter of the read-voltage parameter comprising:

increasing the lower page read-voltage parameter by the controller when N12−N13>0;

decreasing the lower page read-voltage parameter by the controller when N12−N13<0; and calculating AdjL=kL*|N12−N13| to obtain the adjusting-amount AdjL of the lower page read-voltage parameter of the read-voltage parameter by the controller, wherein kL is a real number.

8. A non-volatile memory apparatus comprising:

a non-volatile storage circuit configured to set at least one read-voltage in accordance with a read-voltage parameter of a read command, read a corresponding data voltage set in accordance with an address of the read command, and convert the corresponding data voltage set to a corresponding data in accordance with the at least one read-voltage; and a controller, coupled to the non-volatile storage circuit for providing the read command and receiving the corresponding data, and configured to decide whether to perform an on-the-fly self-adaptive read-voltage adjustment in accordance with a number of error bits of the corresponding data, wherein the on-the-fly self-adaptive read-voltage adjustment comprises: providing a left read-voltage parameter to the non-volatile storage circuit for converting the corresponding data voltage set to a left corresponding data; providing a right read-voltage parameter to the non-volatile storage circuit for converting the corresponding data voltage set to a right corresponding data; and deciding an adjusting-direction and an adjusting-amount of the read-voltage parameter in accordance with a relationship between the corresponding data, the left corresponding data and the right corresponding data, wherein at least one left read-voltage corresponding to the left read-voltage parameter is less than the at least one read-voltage, and at least one right read-voltage corresponding to the right read-voltage parameter is greater than the at least one read-voltage, wherein the corresponding data comprises a upper page corresponding data R1U, and the non-volatile storage circuit converts the corresponding data voltage set to obtain an upper page left corresponding data R2U of the left corresponding data, the non-volatile storage circuit converts the corresponding data voltage set to obtain a upper page right corresponding data R3U of the right corresponding data, wherein the controller counts NA12 changed from logic 1 to logic 0 and NC12 changed from logic 0 to logic 1 between the upper page corresponding data R1U and the upper page left corresponding data R2U, the controller counts NA13 changed from logic 0 to logic 1 and NC13 changed from logic 1 to logic 0 between the upper page corresponding data R1U and the upper page right corresponding data R3U, the controller decides an adjusting-direction and an adjusting-amount of a first upper page read-voltage parameter of the read-voltage parameter in accordance with a relationship between NA12 and NA13, and the controller decides an adjusting-direction and an adjusting-amount of a second upper page read-voltage parameter of the read-voltage parameter in accordance with a relationship between NC12 and NC13, wherein NA12, NA13, NC12 and NC13 are amount of bits.

9. The non-volatile memory apparatus according to claim 8, wherein the non-volatile storage circuit is a multi-level cell flash memory, the controller provides a first upper page left read-voltage parameter and a second upper page left read-voltage parameter of the left read-voltage parameter to the non-volatile storage circuit for converting the corresponding data voltage set to the upper page left corresponding data R2U of the left corresponding data in accordance with the first upper page left read-voltage parameter and the second upper page left read-voltage parameter, the controller provides a first upper page right read-voltage parameter and a second upper page right read-voltage parameter of the right read-voltage parameter to the non-volatile storage circuit for converting the corresponding data voltage set to the upper page right corresponding data R3U of the right corresponding data in accordance with the first upper page right read-voltage parameter and the second upper page right read-voltage parameter.

10. The non-volatile memory apparatus according to claim 9, wherein the controller increase the first upper page read-voltage parameter when NA12−NA13>0, the controller decrease the first upper page read-voltage parameter when NA12−NA13<0, the controller increase the second upper page read-voltage parameter when NC12−NC13>0, the controller decrease the second upper page read-voltage parameter when NC12−NC13<0, the controller calculates AdjU1=kU1*|NA12−NA13| to obtain the adjusting-amount AdjU1 of the first upper page read-voltage parameter of the read-voltage parameter, and the controller calculates AdjU2=kU2*|NC12−NC13| to obtain the adjusting-amount AdjU2 of the second upper page read-voltage parameter of the read-voltage parameter, wherein kU1 and kU2 are real number.

11. An on-the-fly self-adaptive read-voltage adjustment method of a non-volatile memory apparatus comprising:

providing a read command by a controller to a non-volatile storage circuit, and receiving a corresponding data returned from the non-volatile storage circuit, wherein the non-volatile storage circuit sets at least one read-voltage according to a read-voltage parameter of the read command, reads a corresponding data voltage set in accordance with an address of the read command, and converts the corresponding data voltage set to the corresponding data in accordance with the at least one read-voltage;

providing a left read-voltage parameter by the controller to the non-volatile storage circuit for converting the corresponding data voltage set to a left corresponding data in accordance with the left read-voltage parameter, wherein at least one left read-voltage corresponding to the left read-voltage parameter is less than the at least one read-voltage;

providing a right read-voltage parameter by the controller to the non-volatile storage circuit for converting the corresponding data voltage set to a right corresponding data in accordance with the right read-voltage parameter, wherein at least one right read-voltage corresponding to the right read-voltage parameter is greater than the at least one read-voltage; and deciding adaptively an adjusting-direction and an adjusting-amount of the read-voltage parameter in accordance with a relationship between the corresponding data and the left corresponding data and a relationship between the corresponding data and the right corresponding data, wherein the corresponding data comprises a upper page corresponding data R1U, and the step of deciding adaptively the adjusting-direction and the adjusting-amount of the read-voltage parameter comprises:

converting the corresponding data voltage set to obtain a upper page left corresponding data R2U of the left corresponding data;

converting the corresponding data voltage set to obtain a upper page right corresponding data R3U of the right corresponding data;

counting NA12 changed from logic 1 to logic 0 between the upper page corresponding data R1U and the upper page left corresponding data R2U by the controller;

counting NC12 changed from logic 0 to logic 1 between the upper page corresponding data R1U and the upper page left corresponding data R2U by the controller;

counting NA13 changed from logic 0 to logic 1 between the upper page corresponding data R1U and the upper page right corresponding data R3U by the controller;

counting NC13 changed from logic 1 to logic 0 between the upper page corresponding data R1U and the upper page right corresponding data R3U by the controller;

deciding an adjusting-direction and an adjusting-amount of a first upper page read-voltage parameter of the read-voltage parameter by the controller in accordance with a relationship between NA12 and NA13; and deciding an adjusting-direction and an adjusting-amount of a second upper page read-voltage parameter of the read-voltage parameter by the controller in accordance with a relationship between NC12 and NC13, wherein NA12, NA13, NC12 and NC13 are amount of bits.

12. The on-the-fly self-adaptive read-voltage adjustment method according to claim 11, wherein the non-volatile storage circuit is a multi-level cell flash memory, the step of deciding adaptively the adjusting-direction and the adjusting-amount of the read-voltage parameter comprising:

providing the first upper page left read-voltage parameter and a second upper page left read-voltage parameter of the left read-voltage parameter to the non-volatile storage circuit by the controller for converting the corresponding data voltage set to the upper page left corresponding data R2U of the left corresponding data in accordance with the first upper page left read-voltage parameter and the second upper page left read-voltage parameter;

providing a first upper page right read-voltage parameter and a second upper page right read-voltage parameter of the right read-voltage parameter to the non-volatile storage circuit by the controller for converting the corresponding data voltage set to the upper page right corresponding data R3U of the right corresponding data in accordance with the first upper page right read-voltage parameter and the second upper page right read-voltage parameter.

13. The on-the-fly self-adaptive read-voltage adjustment method according to claim 12, wherein the step of deciding the adjusting-direction and the adjusting-amount of the first upper page read-voltage parameter of the read-voltage parameter comprising:

increasing the first upper page read-voltage parameter by the controller when NA12−NA13>0;

decreasing the first upper page read-voltage parameter by the controller when NA12−NA13<0; and calculating $AdjU1=kU1*|NA12-NA13|$ to obtain the adjusting-amount AdjU1 of the first upper page read-voltage parameter of the read-voltage parameter by the controller, wherein kU1 is a real number.

14. The on-the-fly self-adaptive read-voltage adjustment method according to claim 12, wherein the step of deciding the adjusting-direction and the adjusting-amount of the second upper page read-voltage parameter of the read-voltage parameter comprising:

increasing the second upper page read-voltage parameter by the controller when NC12−NC13>0;

decreasing the second upper page read-voltage parameter by the controller when NC12−NC13<0; and calculating $AdjU2=kU2*|NC12-NC13|$ to obtain the adjusting-amount AdjU2 of the second upper page read-voltage parameter of the read-voltage parameter by the controller, wherein kU2 is a real number.

* * * * *